United States Patent
Adusumilli et al.

(10) Patent No.: US 9,786,596 B2
(45) Date of Patent: Oct. 10, 2017

(54) FUSE FORMED FROM III-V ASPECT RATIO STRUCTURE

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/065,297

(22) Filed: Mar. 9, 2016

(65) Prior Publication Data

US 2017/0263554 A1    Sep. 14, 2017

(51) Int. Cl.
*H01L 23/525* (2006.01)
*H01L 29/20* (2006.01)
*H01L 21/308* (2006.01)
*H01L 21/3213* (2006.01)

(52) U.S. Cl.
CPC ........ *H01L 23/5256* (2013.01); *H01L 21/308* (2013.01); *H01L 21/32139* (2013.01); *H01L 29/20* (2013.01)

(58) Field of Classification Search
CPC .............. H01L 23/5256; H01L 21/308; H01L 21/32139
See application file for complete search history.

(56) References Cited

U.S. PATENT DOCUMENTS

| | | |
|---|---|---|
| 6,249,038 B1 | 6/2001 | Daubenspeck et al. |
| 7,759,766 B2 | 7/2010 | Booth, Jr. et al. |
| 8,053,809 B2 | 11/2011 | Cheng et al. |
| 8,471,296 B2 | 6/2013 | Cheng et al. |
| 8,492,286 B2 | 7/2013 | Utomo et al. |
| 8,609,534 B2 | 12/2013 | Yang et al. |
| 8,937,299 B2 | 1/2015 | Basu et al. |
| 2007/0029576 A1 | 2/2007 | Nowak et al. |
| 2011/0049568 A1 | 3/2011 | Lochtefeld et al. |
| 2015/0069521 A1* | 3/2015 | Cheng .............. H01L 29/78696 257/379 |
| 2015/0179632 A1 | 6/2015 | Sidelnicov et al. |
| 2016/0027733 A1* | 1/2016 | Bao .................... H01L 23/5226 257/529 |

OTHER PUBLICATIONS

Rizzolo, R.F. et al., "IBM System z9 eFUSE applications and methodology", IBM J. Res. & Dev., Jan./Mar. 2007, vol. 51, No. 1/2, pp. 65-75.

* cited by examiner

*Primary Examiner* — Errol Fernandes
(74) *Attorney, Agent, or Firm* — Scully, Scott, Murphy & Presser, P.C.; Louis J. Percello, Esq.

(57) ABSTRACT

A fuse structure is provided above a first portion of a semiconductor material. The fuse structure includes a first end region containing a first portion of a metal structure having a first thickness, a second end region containing a second portion of the metal structure having the first thickness, and a neck region located between the first and second end regions. The neck region contains a third portion of the metal structure having a second thickness that is less than the first thickness, wherein a portion of the neck region is located in a gap positioned between a bottom III-V compound semiconductor material portion and a top III-V compound semiconductor material portion.

11 Claims, 10 Drawing Sheets

US 9,786,596 B2

FUSE FORMED FROM III-V ASPECT RATIO STRUCTURE

BACKGROUND

The present application relates to a semiconductor structure and a method of forming the same. More particularly, the present application relates to a fuse structure in which a portion of the neck region of the fuse structure is defined by a gap formed between a bottom III-V compound semiconductor material portion and a top III-V compound semiconductor material portion of an III-V aspect ratio trapping structure. The present application also relates to a method of forming such a fuse structure.

III-V compound semiconductor material co-integration is one technology option for future complementary metal oxide semiconductor (CMOS) nodes. III-V compound semiconductor materials typically require an aspect ratio trapping process to reduce defect levels to a reasonable number to manufacture high performance semiconductor devices. Fuses are used in a variety of circuit applications, also in III-V compound semiconductor material containing circuits. A fuse is a structure that can be blown in accordance with a suitable electrical current. For example, an electrical current is provided through a fuse to eventually cause the fuse to blow and create an opening circuit. It is highly desirable to fabricate on-chip fuses during CMOS fabrication to minimize process cost and improve system integration.

SUMMARY

In one aspect of the present application, a semiconductor structure is provided. In one embodiment of the present application, the semiconductor structure includes a fuse structure located above a first portion of a semiconductor material. The fuse structure includes a first end region containing a first portion of a metal structure having a first thickness, a second end region containing a second portion of the metal structure having the first thickness, and a neck region located between the first and second end regions. The neck region contains a third portion of the metal structure having a second thickness that is less than the first thickness, wherein a portion of the neck region is located in a gap positioned between a bottom III-V compound semiconductor material portion and a top III-V compound semiconductor material portion.

In some embodiments of the present application, the semiconductor structure further includes another fuse structure located above a second portion of the semiconductor material and separated from the fuse structure by a planarized dielectric material. In such an embodiment, the another fuse structure includes a first end region containing a first portion of another metal structure having the first thickness, a second end region containing a second portion of the another metal structure having the first thickness, and a neck region located between the first and second end regions of the another metal structure. The neck region contains a third portion of the another metal structure having the second thickness, wherein a portion of the neck region of the another metal structure is located in a gap positioned between another bottom III-V compound semiconductor material portion and another top III-V compound semiconductor material portion.

In another aspect of the present application, a method of forming a semiconductor structure is provided. In one embodiment of the present application, the method includes forming an III-V aspect ratio trapping structure in at least one opening present in a dielectric material structure, wherein the opening exposes a surface of a semiconductor material and the III-V aspect ratio trapping structure comprises, from bottom to top, a first III-V compound semiconductor material, a second III-V compound semiconductor material, and a third III-V compound semiconductor material. A hard mask is then formed protecting one of the III-V aspect ratio trapping structures, and thereafter portions of the semiconductor material that lie adjacent the protected III-V aspect ratio trapping structure are exposed. Next, the second III-V compound semiconductor material of the protected III-V aspect ratio trapping structure is removed selective to the first and third III-V compound semiconductor materials to provide a gap between the first and third III-V compound semiconductor materials. A metal-containing material having a topmost surface that is coplanar with a topmost surface of the hard mask is then formed on both sides of the first and third III-V compound semiconductor materials and within the gap. Next, a cut mask is formed above the metal-containing material and the hard mask located above the first and third III-V compound semiconductor materials. Exposed portions of the metal-containing material, the hard mask, and the first and third III-V compound semiconductor materials are then etched utilizing the cut mask as etch mask to provide a fuse structure.

DETAILED DESCRIPTION

Figure 1A:
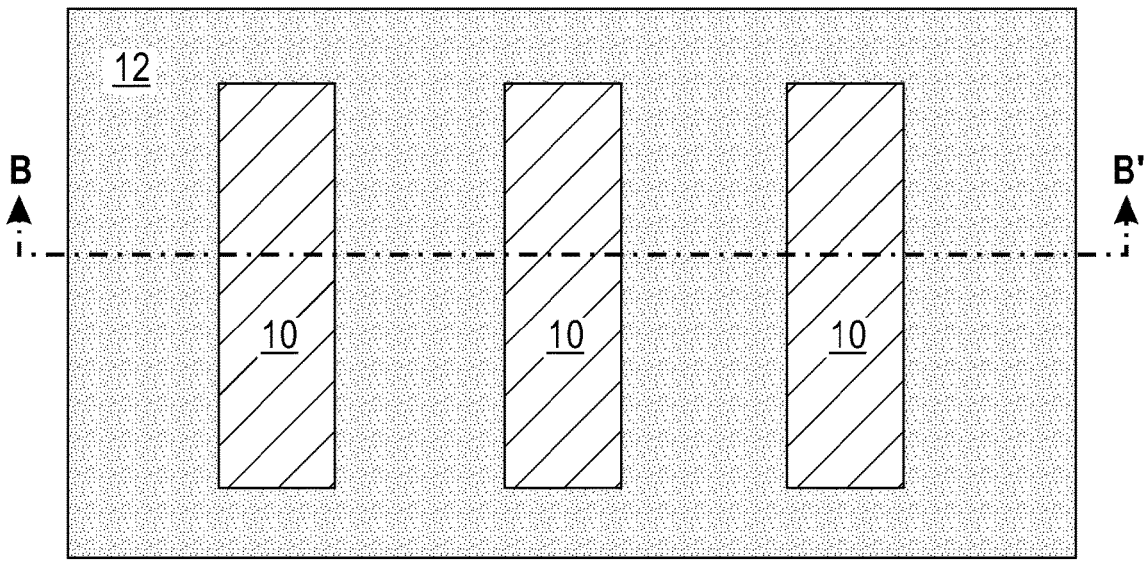
FIG. 1A is a top down view an exemplary semiconductor structure including a dielectric material structure having at least one opening that exposes a surface of a semiconductor material that can be employed in accordance with one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
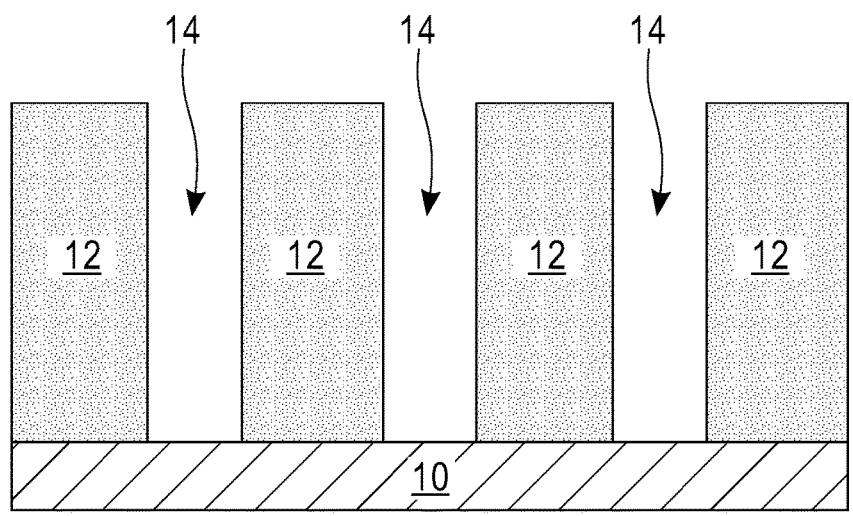
FIG. 1B is a cross view of the exemplary semiconductor structure of FIG. 1A through vertical plane B-B'.

Referring first to FIGS. 1A-1B, there are illustrated various views of an exemplary semiconductor structure including a dielectric material structure 12 having at least one opening 14 that exposes a surface of a semiconductor material 10 that can be employed in accordance with one embodiment of the present application. The exposed surface of the semiconductor material 10 may be a topmost surface, or a sub-surface that is located between the topmost surface and bottommost surface of the semiconductor material. The openings 14 may also be referred to as trenches.

The semiconductor material 10 that can be employed in the present application includes any semiconductor material having semiconducting properties. Examples of semiconductor materials that may be employed as the semiconductor material 10 include, but are not limited to, silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, silicon is used as the semiconductor material 10.

In one embodiment of the present application, the semiconductor material 10 may be a single crystalline semiconductor material. The semiconductor material 10 may have any of the well known crystal orientations. For example, the crystal orientation of the first semiconductor material 10 may be {100}, {110}, or {111}. Other crystallographic orientations besides those specifically mentioned can also be used in the present application.

In one embodiment of the present application, the semiconductor material 10 may comprise at least an upper portion of a bulk semiconductor substrate. By "bulk semiconductor substrate" it is meant a substrate that is composed entirely of at least one semiconductor material with no dielectric materials and/or conductor materials present therein. In another embodiment of the present application, the semiconductor material 10 may be a topmost semiconductor material layer of a semiconductor-on-insulator (SOI) substrate that further includes an insulator layer (not shown) and a handle substrate (also not shown) located directly beneath the topmost semiconductor material layer of the SOI substrate.

In one embodiment, the dielectric material structure 12 having the at least one opening 14 may be formed by first providing a blanket layer of a dielectric hard mask material (not shown) over the topmost surface of the semiconductor material 10. The blanket layer of a dielectric hard mask material (not shown) is a contiguous layer that covers the entirety of the topmost surface of the semiconductor material 10. The blanket layer of a dielectric hard mask material that is employed in the present application may include an oxide, a nitride and/or an oxynitride. In one embodiment, the blanket layer of a dielectric hard mask material can be comprised of silicon dioxide.

In some embodiments, the blanket layer of a dielectric hard mask material can be formed by a deposition process such as, for example, chemical vapor deposition (CVD) or plasma enhanced chemical vapor deposition (PECVD). In one embodiment of the present application, the thickness of the blanket layer of a dielectric hard mask material can range from 50 nm to 200 nm.

After forming the blanket layer of a dielectric hard mask material on the topmost surface of the semiconductor material 10, the at least opening 14 is formed. In FIGS. 1A-1B, three openings 14 are shown by way of one example. The number of openings 14 may vary so long as at least one opening 14 is formed in the area in which a fuse structure is to be subsequently formed. In some embodiments, each opening 14 may be formed by a patterning process. The blanket layer of a dielectric hard mask material that remains after forming each opening 14 is referred to herein as the dielectric material structure 12.

In one embodiment, the patterning process used to define each opening 14 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After etching, the patterned photoresist can be removed utilizing any photoresist stripping process such as, for example, ashing.

In another embodiment, the patterning process used to define each opening 14 may include a sidewall image transfer (SIT) process. In yet another embodiment, the patterning process used to define each opening 14 may include a direct self-assembly (DSA) patterning process.

In an alternative embodiment of the present application, the exemplary semiconductor structure shown in FIGS. 1A-1B can be formed by first providing a plurality of semiconductor fins (not shown) extending upwards from a surface of the semiconductor material 10. The semiconductor fins can be formed from a semiconductor substrate utilizing one of the above mentioned patterning processes. Next, the hard mask material that provides the dielectric material structure 12 is formed between each semiconductor fin and thereafter a planarization process such as, for example, chemical mechanical polishing (CMP) may be employed. Each semiconductor fin is then removed utilizing an etch to form the openings 14. The etch may include HCl gas.

In some embodiments, each opening 14 has a height that is the same as the thickness of the blanket layer of dielectric hard mask material used to provide the dielectric material structure 12. In other embodiments, each opening 14 has a height of the semiconductor fins mentioned above. In either instance, each opening 14 has an aspect ratio (width to height) that can be in a range from 1:3 to 1:10. The bottom of the opening 14 can have a V-shape, rounded or flat.

Figure 2A:
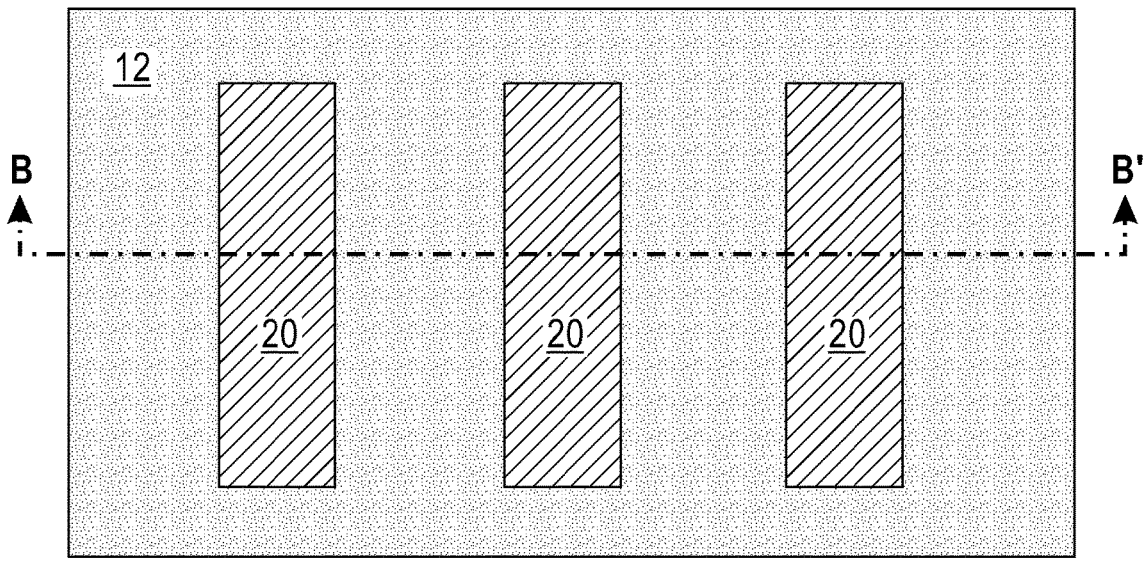
FIG. 2A is a top down view of the exemplary semiconductor structure of FIGS. 1A-1B after forming an III-V aspect ratio trapping structure including, from bottom to top, a first III-V compound semiconductor material, a second III-V compound semiconductor material, and a third III-V compound semiconductor material in the at least one opening.
Figure 2B:
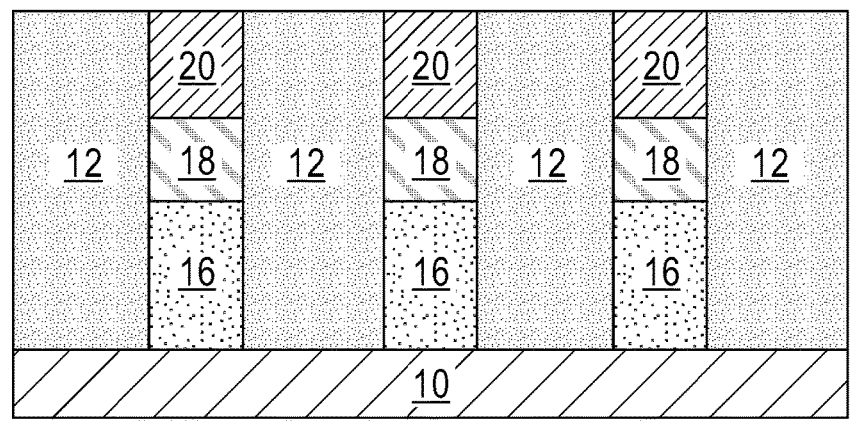
FIG. 2B is a cross view of the exemplary semiconductor structure of FIG. 2A through vertical plane B-B'.

Referring now to FIGS. 2A-2B, there are illustrated the exemplary semiconductor structure of FIGS. 1A-1B after forming an III-V aspect ratio trapping structure including, from bottom to top, a first III-V compound semiconductor material 16, a second III-V compound semiconductor material 18, and a third III-V compound semiconductor material 20 in the at least one opening 14. As is shown, the first III-V compound semiconductor material 16 of each aspect ratio trapping structure is formed in a bottom portion of each opening 14, each second III-V compound semiconductor material 16 is formed in a middle portion of each opening 14, and each third III-V compound semiconductor material 20 is formed in an upper portion of each opening 14.

Each first III-V compound semiconductor material 16 has a bottommost surface that directly contacts an exposed portion of the semiconductor material 10 that is provided by opening 14. Each second III-V compound semiconductor material 18 has a bottommost surface that directly contacts a topmost surface of an underlying first III-V compound semiconductor material 16, and each third III-V compound semiconductor material 20 has a bottommost surface that directly contacts a topmost surface of an underlying second III-V compound semiconductor material 18. As is shown, the topmost surface of each third III-V compound semiconductor material 20 is coplanar with a topmost surface of the dielectric material structure 12.

As is shown and within each opening 14, the sidewall surfaces of the first III-V compound semiconductor material 16, the second III-V compound semiconductor material 18, and the third III-V compound semiconductor material 20 are vertically aligned with each other.

In the present application, the second III-V compound semiconductor material 18 of each III-V aspect ratio trapping structure comprises an III-V compound semiconductor material that has a different etch selectivity as compared to the first and third III-V compound semiconductor materials 16, 20. In some embodiments, the first III-V compound semiconductor material 16 and the third III-V compound semiconductor material 20 comprise a same III-V material, which differs from the III-V compound semiconductor material that provides the second III-V compound semiconductor 18. In one example, the first and third III-V compound semiconductor materials 16, 20 are composed of GaAs or InGaAs, while the second semiconductor material 18 is composed of InP. In another embodiment, the first III-V compound semiconductor material 16 comprises a different III-V compound semiconductor than the third semiconductor material 20, and the second III-V compound semiconductor material 18 comprises a different III-V compound semiconductor than the III-V compound semiconductor materials that provide the first and third III-V compound semiconductor materials 16, 20. In one example, the first III-V compound semiconductor material 16 is composed of GaAs, the second III-V compound semiconductor material 18 is composed of InP, and the third III-V compound semiconductor material 20 may be composed of InGaAs.

In accordance with the present application the first III-V compound semiconductor material 16 may comprise a first height, the second III-V compound semiconductor material 18, may comprise a second height, and the third III-V compound semiconductor material 20 may comprise a third height. In accordance with one embodiment of the present application, the second height of the second III-V compound semiconductor material 18 is less than both of the first height of the first III-V compound semiconductor material 16 and the third height of the third III-V compound semiconductor material 20. In some embodiments, the first and third heights may be the same. In other embodiments, the first and third heights may be different. In one example, the first height is greater than the third height. In another embodiment, the first height is less than the second height. In one example, the first height can be from 60 nm to 80 nm, the second height can be form 20 to 30 nm, and the third height can be from 30 to 50 nm.

In the present application, the first III-V compound semiconductor material 16 has a first defect density, the second III-V compound semiconductor material 18 has a second defect density and the third III-V compound semiconductor material 20 has a third defect density, wherein the first defect density is greater than the second and third defect densities. In some embodiments, the second and third defect density may be the same. In other embodiments, the third defect density is less than the second defect density.

Each III-V aspect ratio trapping structure (16, 18, 20) that is provided can be formed utilizing an epitaxial semiconductor regrowth process such as is described, for example, in U.S. Patent Application Publication No. 2011/0049568 to Lochtefeld et al., the entire content and disclosure of which is incorporated herein by reference. Each III-V aspect ratio trapping structure (including each first III-V compound semiconductor material 16, each second III-V compound semiconductor material 18, and each third III-V compound semiconductor material 20) has an epitaxial relationship, i.e., same crystal orientation, with the exposed portion (i.e., surface) of the semiconductor material 10 which is used as the growth surface for each III-V aspect ratio trapping structure.

In some embodiments of the present application, the selected crystallographic direction of the first III-V compound semiconductor material 16 is aligned with at least one propagation direction of threading dislocations in the opening 14 in which each III-V aspect ratio trapping structure is formed. Threading dislocations in this region may substantially terminate at the sidewall of the neighboring dielectric material structure 12. In one embodiment of the present application, the selected crystallographic direction of the exposed surface of the semiconductor material 10 is aligned with direction of propagation of threading dislocations in the first III-V compound semiconductor material 16 of each aspect ratio trapping structure. In certain embodiments, the orientation angle ranges from about 30 to about 60 degrees, for example, is about 45 degrees to such crystallographic direction. In some embodiments, the selected crystallographic direction is substantially aligned with a <110> crystallographic direction of the semiconductor material 10.

Each III-V aspect ratio trapping structure (16, 18, 20) can be formed by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas for providing each of the first, second and third III-V compound semiconductor materials may include at least one precursor gas and a carrier gas, such as, for example hydrogen. The reactor chamber is heated, such as, for example, by RF-heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

In some embodiments of the present application, and after performing the epitaxial semiconductor regrowth process defined above, a planarization process such as, for example, chemical mechanical polishing (CMP) and/or grinding may be performed to provide the exemplary semiconductor structure shown in FIGS. 2A-2B.

Figure 3A:
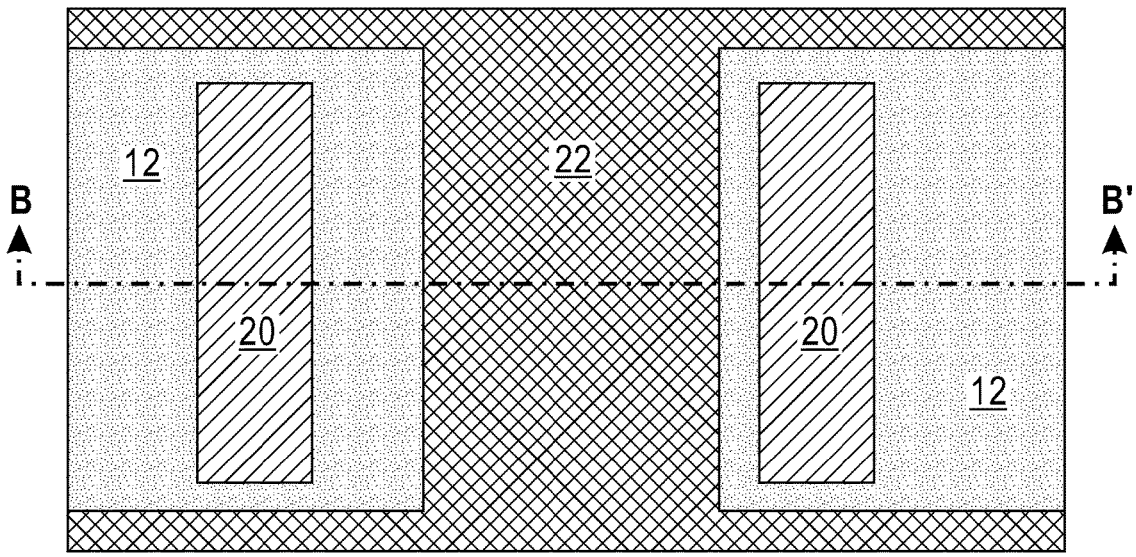
FIG. 3A is a top down view of the exemplary semiconductor structure of FIGS. 2A-2B after forming a hard mask protecting one of the III-V aspect ratio trapping structures.
Figure 3B:
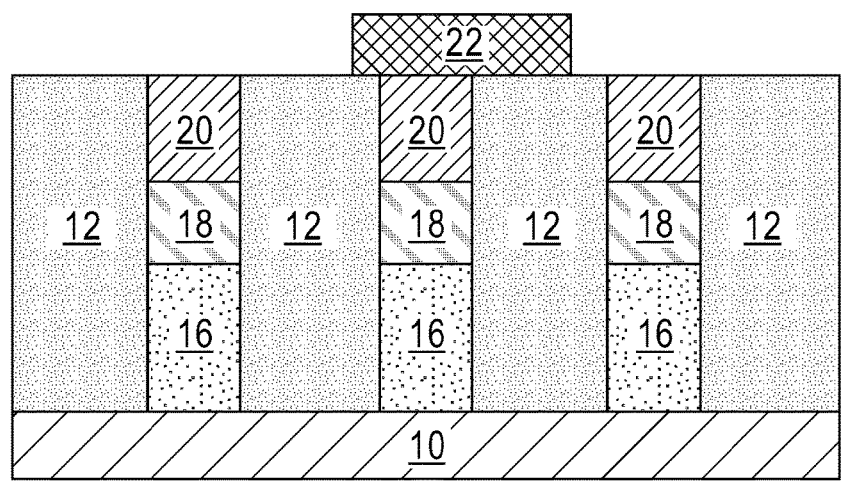
FIG. 3B is a cross view of the exemplary semiconductor structure of FIG. 3A through vertical plane B-B'.

Referring now to FIGS. 3A-3B, there are shown various views of the exemplary semiconductor structure of FIGS. 2A-2B after forming a hard mask 22 protecting one of the III-V aspect ratio trapping structures (16, 18, 20); in the drawings the hard mask 22 protects a middle III-V aspect ratio trapping structure that is flanked on either side by a left side III-V aspect ratio trapping structure (16, 18, 20) and a right side III-V aspect ratio trapping structure (16, 18, 20). In some embodiments and at this point of the present application, a block mask may be formed over a region of the exemplary semiconductor structure in which CMOS devices can be formed.

In some embodiments (not shown), the hard mask 22 may include sidewall surfaces that are vertically aligned with the one underlying III-V aspect ratio trapping structure (16, 18, 20) in which the hard mask 22 protects. In other embodiments (and as shown), the hard mask 22 may include sidewall surfaces that extend beyond the sidewall surfaces of the one underlying III-V aspect ratio trapping structure (16, 18, 20) in which the hard mask 22 protects. The hard mask 22 may include on the hard mask materials mentioned above in forming the dielectric material structure 12 so long as the hard mask material selected for providing the hard mask 22 is different from the hard mask materials that provides the dielectric material structure. In one example, the hard mask 22 is composed of silicon nitride, while the dielectric material structure 12 is composed of silicon dioxide.

The hard mask 22 can be formed by first depositing a blanket layer of a hard mask material utilizing one of the deposition processes mentioned above for forming the blanket layer of hard mask material that can provide the dielectric material structure 12. After depositing, lithography and etching are used to provide the hard mask 22.

Figure 4A:
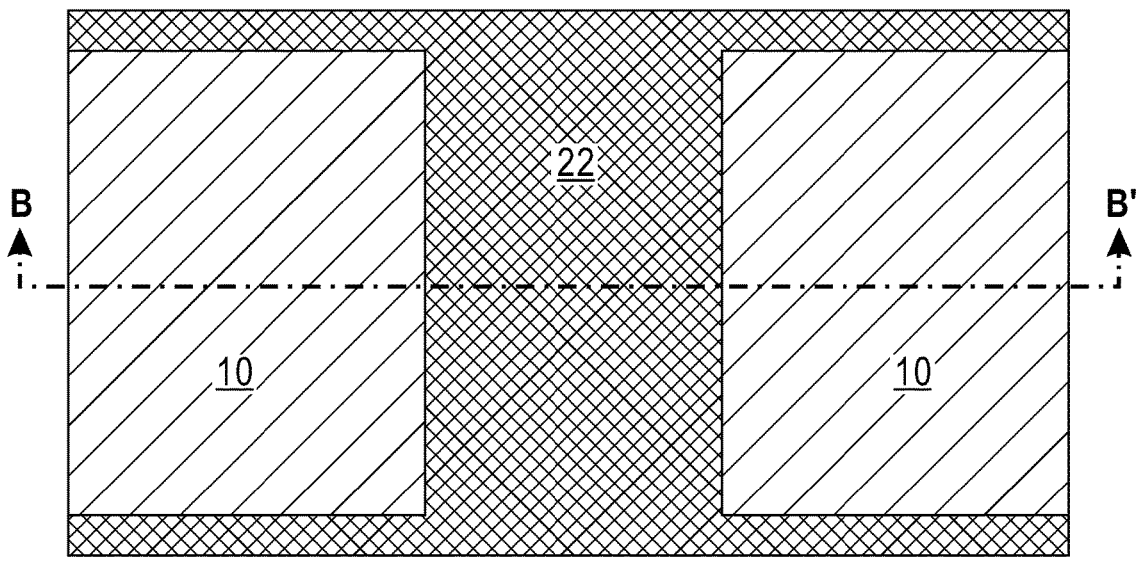
FIG. 4A is a top down view of the exemplary semiconductor structure of FIGS. 3A-3B after exposing portions of the semiconductor material that lie adjacent the protected III-V aspect ratio trapping structure.
Figure 4B:
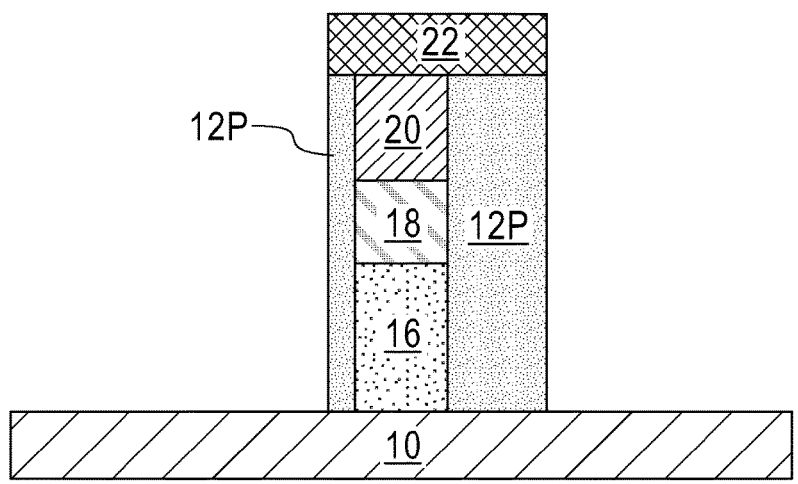
FIG. 4B is a cross view of the exemplary semiconductor structure of FIG. 4A through vertical plane B-B'.

Referring now to FIGS. 4A-4B, there are illustrated various views of the exemplary semiconductor structure of FIGS. 3A-3B after exposing portions of the semiconductor material 10 that lie adjacent the protected III-V aspect ratio trapping structure (i.e., the middle III-V aspect ratio trapping structure). The exposing portions of the semiconductor material 10 that lie adjacent the protected III-V aspect ratio trapping structure (i.e., the III-V middle aspect ratio trapping structure) is performed utilizing at least one anisotropic etching process such as, for example, reactive ion etching, utilizing the hard mask 22 as an etch mask. In the embodiment illustrated in the drawings, the at least one anisotropic etch removes exposed portions of the dielectric material structure 12 not protected by the hard mask 22 and well as the exposed portions of each III-V aspect ratio trapping structure that are also not protected by the hard mask 22.

In some embodiments, and when the sidewall surfaces of the hard mask 22 are not vertically aligned with the sidewall surfaces of the one underlying III-V aspect ratio trapping structure (16, 18, 20) in which the hard mask 22 protects, portions of the dielectric material structure (hereinafter dielectric material structure portions 12P) may remain on the sidewall surfaces of the one underlying III-V aspect ratio trapping structure (16, 18, 20) that the hard mask 22 protects.

Figure 5:
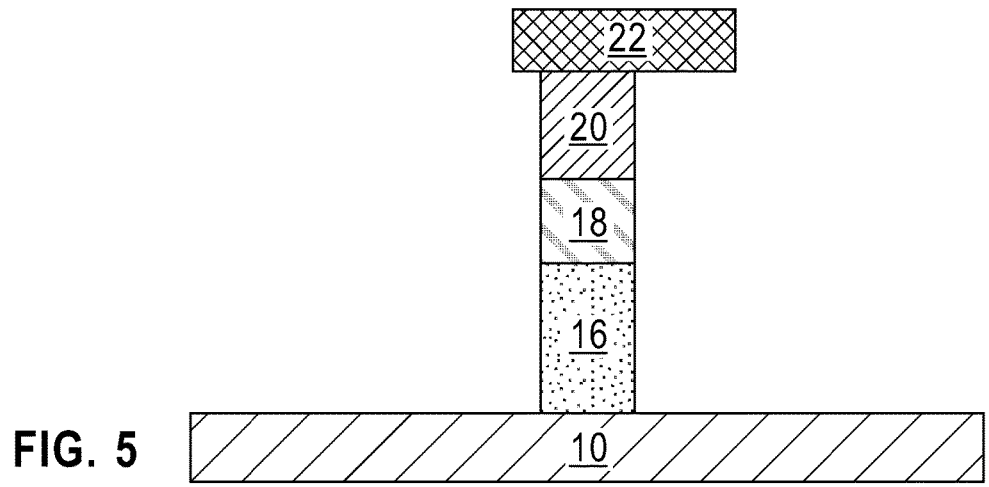
FIG. 5 is a cross sectional view of the exemplary semiconductor structure of FIGS. 4A-4B after exposing the sidewalls of the protected III-V aspect ratio trapping structure.

Referring now to FIG. 5, there is illustrated the exemplary semiconductor structure of FIGS. 4A-4B after exposing the sidewalls of the protected III-V aspect ratio trapping structure (i.e., the middle III-V aspect ratio trapping structure that is protected by hard mask 22). In some embodiments in which the hard mask 22 has sidewall surfaces that are vertically aligned with the sidewall surfaces of the one underlying III-V aspect ratio trapping structure (16, 18, 20) in which the hard mask 22 protects, this step may be omitted. The exposing the sidewalls of the protected III-V aspect ratio trapping structure (i.e., the middle III-V aspect ratio trapping structure that is protected by hard mask 22) may be performed utilizing a lateral wet etching process. In one example, and when the hard mask 22 is composed of silicon nitride, and each dielectric material structure portion 12P is composed of silicon dioxide, an aqueous hydrofluoric acid (HF) chemical etchant may be employed.

Figure 6:
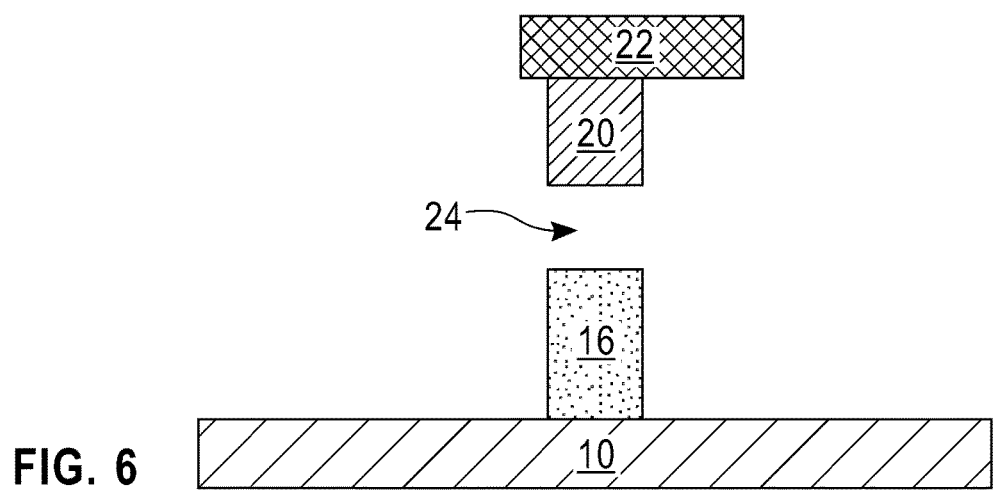
FIG. 6 is a cross sectional view of the exemplary semiconductor structure of FIG. 5 after removing the second III-V compound semiconductor material of the protected III-V aspect ratio trapping structure.

Referring now to FIG. 6, there is illustrated the exemplary semiconductor structure of FIG. 5 after removing the second III-V compound semiconductor material 18 of the protected III-V aspect ratio trapping structure (i.e., the middle III-V aspect ratio trapping structure that is protected by hard mask 22). The removal of the second III-V compound semiconductor material 18 of the protected III-V aspect ratio trapping structure (i.e., the III-V middle aspect ratio trapping structure that is protected by hard mask 22) provides a gap 24 located between the first III-V compound semiconductor material 16 and the third III-V compound semiconductor material 20. The hard mask 22 serves as an anchoring element during this step of the present application. The removal of the second III-V compound semiconductor material 18 of the protected III-V aspect ratio trapping structure (i.e., the III-V middle aspect ratio trapping structure that is protected by hard mask 22) may include a wet etch process that is selective in removing the III-V compound semiconductor material that provides the second III-V compound semiconductor material 18 relative to the first and third III-V compound semiconductor materials 16, 20. In one example, and when the second III-V compound semiconductor material 18 is composed of InP, and the first III-V compound semiconductor material 16 is composed of GaAs, and the third III-V compound semiconductor material 20 is composed of InGaAs, aqueous hydrochloric acid (HCl) can be used as a chemical etchant for selectively removing the second III-V compound semiconductor material 18 relative to the first and third III-V compound semiconductor materials 16, 20.

Figure 7:
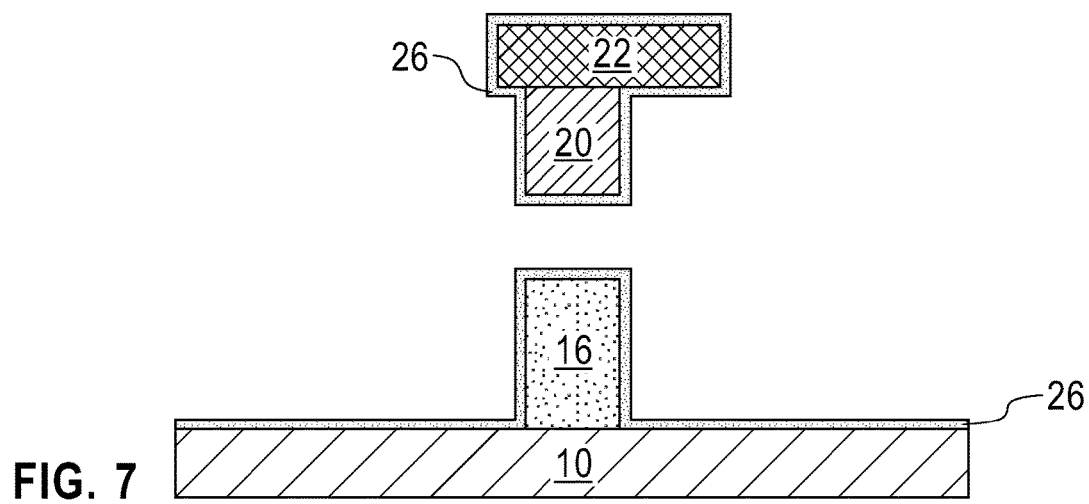
FIG. 7 is a cross sectional view of the exemplary semiconductor structure of FIG. 6 after forming a dielectric material liner having a dielectric constant greater than silicon dioxide (i.e., high-k dielectric material liner).

Referring now to FIG. 7, there is illustrated the exemplary semiconductor structure of FIG. 6 after forming a dielectric material liner 26 having a dielectric constant greater than silicon dioxide (i.e., high-k dielectric material liner). The dielectric material layer 26 is formed on exposed portions of the semiconductor material 10, the exposed sidewall surfaces and the topmost surface of the first III-V compound semiconductor material 16, the exposed bottommost surface and sidewall surfaces of the third III-V compound semiconductor material 20, and the exposed portions of the bottommost surface, sidewall surfaces and topmost surface of the hard mask 22. A portion, but not the entirety of gap 24, is filled with the dielectric material liner 26.

In some embodiments of the present application, the dielectric material liner 26 includes a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfOxN_y$, $ZrOxN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The dielectric material liner 26 can be formed by any deposition technique including, for example, chemical vapor deposition (CVD), plasma enhanced chemical vapor deposition (PECVD), physical vapor deposition (PVD), sputtering, or atomic layer deposition. In one embodiment of the present application, dielectric material liner 26 can have a thickness in a range from 1 nm to 10 nm. Other thicknesses that are lesser than, or greater than, the aforementioned thickness range can also be employed for dielectric material liner 26.

Figure 8A:
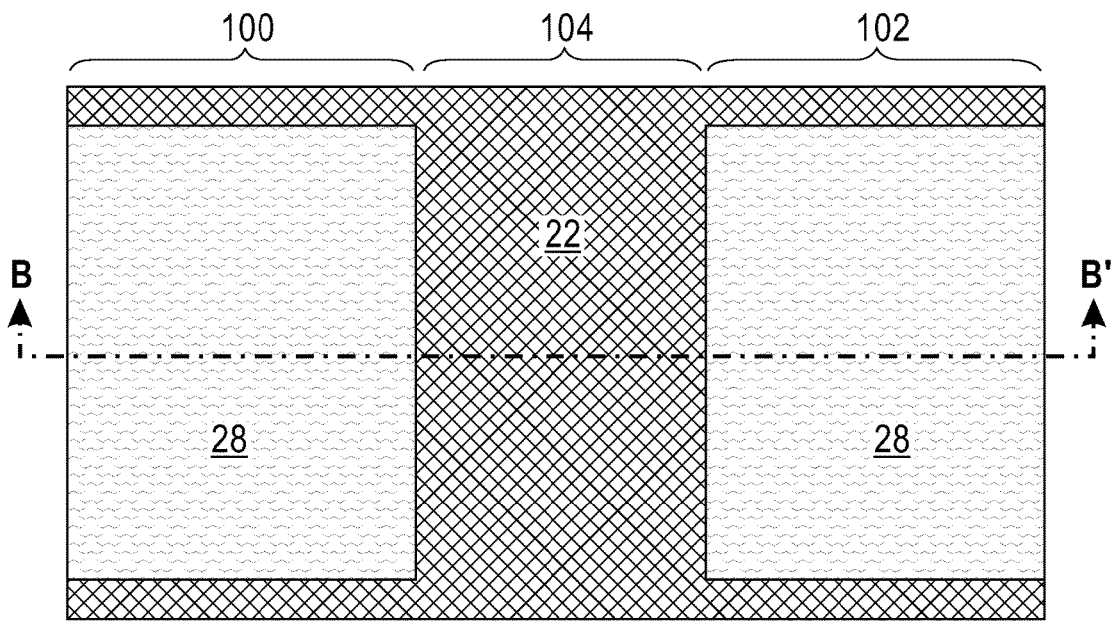
FIG. 8A is a top down view of the exemplary semiconductor structure of FIG. 7 after forming a metal-containing material having a topmost surface that is coplanar with a topmost surface of the hard mask.
Figure 8B:
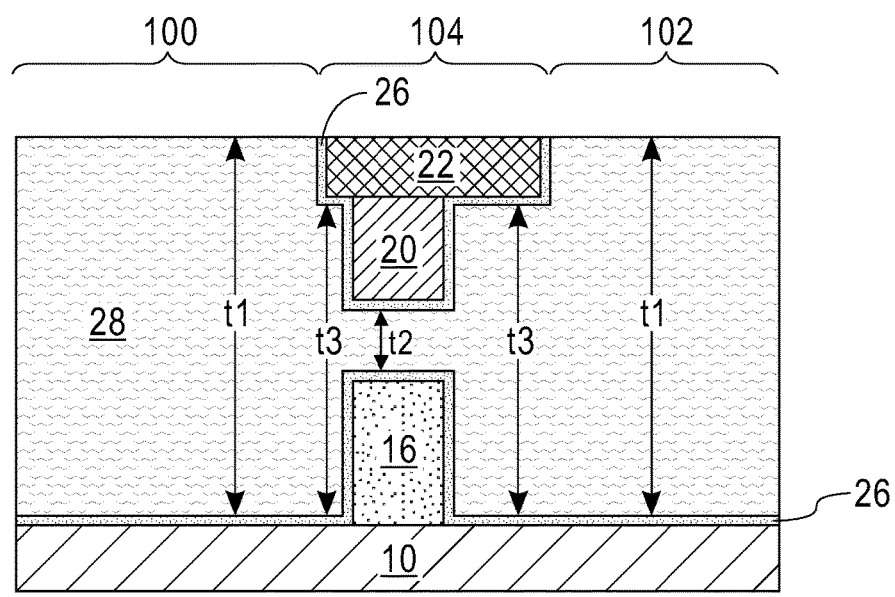
FIG. 8B is a cross view of the exemplary semiconductor structure of FIG. 8A through vertical plane B-B'.

Referring now to FIGS. 8A-8B, there is illustrated various views of the exemplary semiconductor structure of FIG. 7 after forming a metal-containing material 28 having a topmost surface that is coplanar with a topmost surface of the hard mask 22; the metal-containing material 28 is formed on both sides of the first and third III-V compound semiconductor materials 16, 20 and within gap 24. In the drawings, regions 100 and 102 are end regions of the metal-containing material 28 and region 104 is a neck region of the metal-containing material 28 that connects the two end regions 100, 102. The metal-containing material 28 is of unitary construction (i.e., a single piece comprised of a same material).

The metal-containing material 28 is formed on the exposed surfaces of the dielectric material layer 26 and fills the remaining volume of gap 24. The metal-containing material 28 may include an elemental metal or metal alloy. In some embodiments, the metal-containing material 28 may comprise aluminum (Al), copper (Cu), titanium (Ti), tungsten (W), cobalt (Co) or alloys thereof such as, for example, TiAl, or CuAl. The metal-containing material 28 may be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. A planarization process such as, for example, CMP, may follow the deposition process.

The portion of the metal-containing material 28 within the end regions 100, 102 both have a first thickness, t1, while the portion of the metal-containing material 28 in the neck region 104 has a second thickness, t2, that is less than the first thickness, t1. In some embodiments, and as illustrated, the neck region 104 may also include a portion of the metal-containing material 28 that has a third thickness, t3, that is greater than the second thickness, t2, but less than the first thickness t1.

Figure 9:
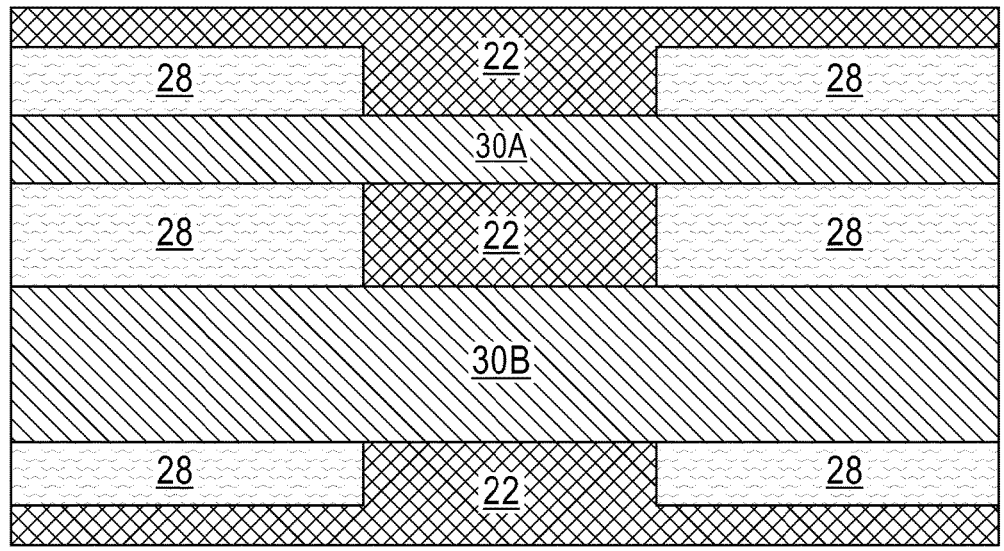
FIG. 9 is a top down view of the exemplary semiconductor structure of FIGS. 8A-8B after forming a first cut mask having a first dimension and forming a second cut mask having a second dimension that is larger than the first dimension.

Referring now to FIG. 9, there is illustrated the exemplary semiconductor structure of FIGS. 8A-8B after forming a first cut mask 30A having a first dimension and forming a second cut mask 30B having a second dimension that is larger than the first dimension. The first cut mask 30A and the second cut mask 30B can be formed by first forming a blanket layer of one of the hard mask materials mentioned above for the dielectric material structure 12. The hard mask material used to provide the first cut mask 30A and the second cut mask 30B is a different hard mask material than the hard mask material that provides mask 22. The first cut mask 30A and the second cut mask 30B can be formed by deposition of a hard mask material followed by lithography and etching. Although the present application describes and illustrates an embodiment in which two different cut masks are employed, the present application can be employed when a single cut mask is used. Alternatively, the present application also contemplates embodiments when multiple cut masks (having the same dimensions or different dimensions) can also be used.

Figure 10A:
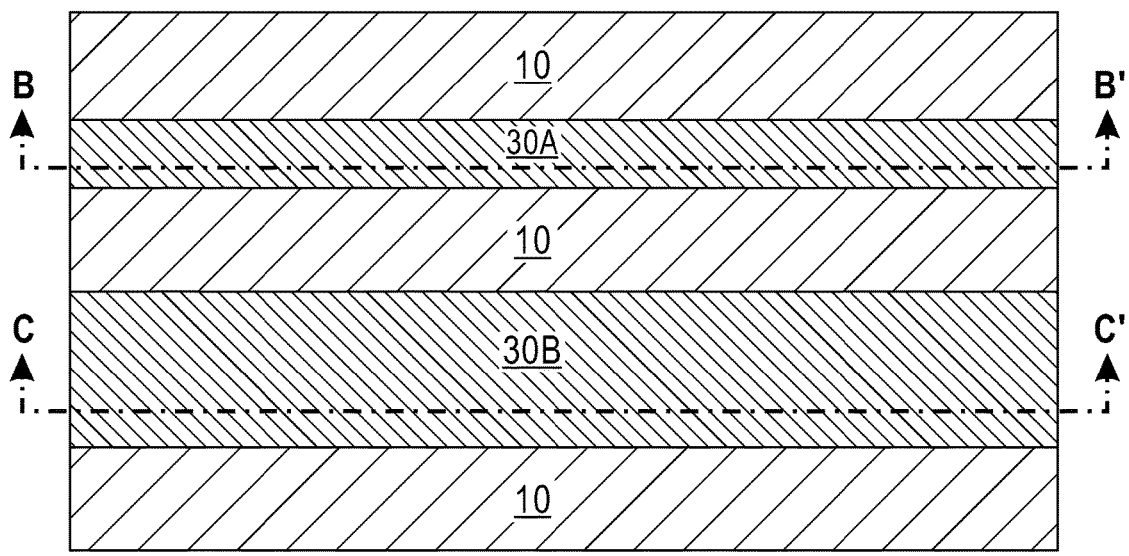
FIG. 10A is a top down view of the exemplary semiconductor structure of FIG. 9 after etching utilizing the first cut mask to provide a first fuse structure having the first dimension, and the second cut mask to provide a second fuse structure having the second dimension.
Figure 10B:
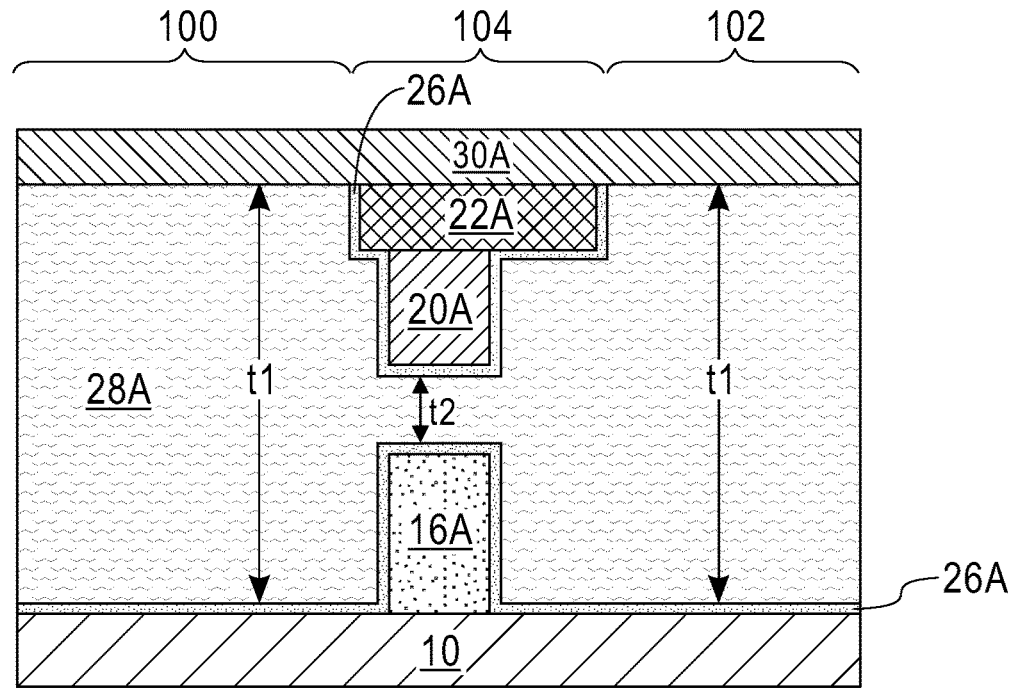
FIG. 10B is a cross view of the exemplary semiconductor structure of FIG. 10A through vertical plane B-B'.
Figure 10C:
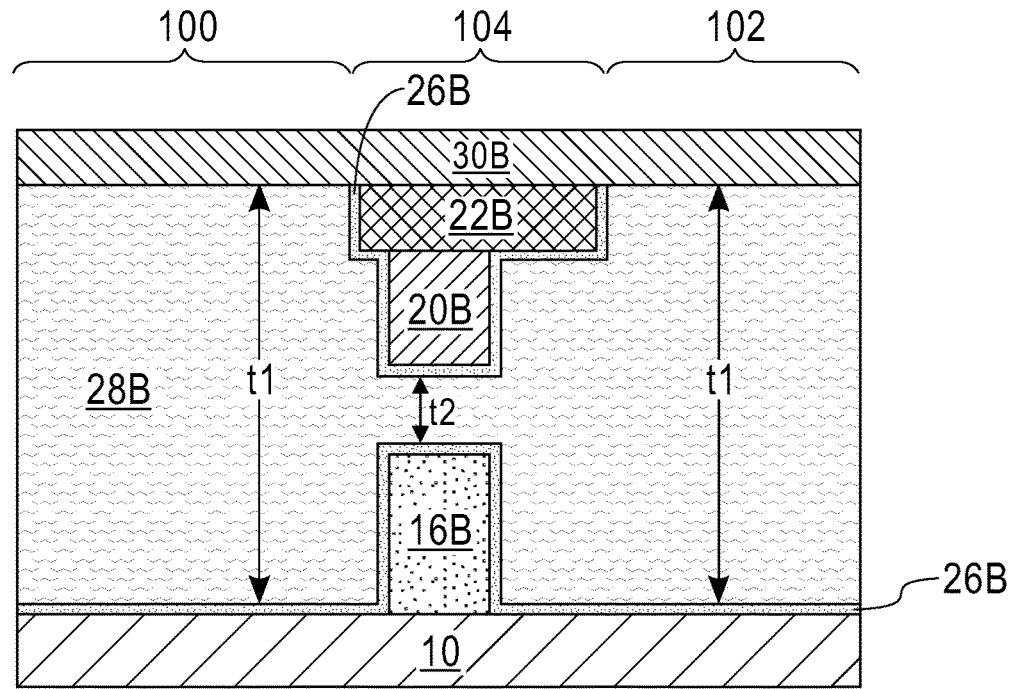
FIG. 10C is a cross view of the exemplary semiconductor structure of FIG. 10A through vertical plane C-C'.

Referring now to FIGS. 10A-10C, there are shown various views of the exemplary semiconductor structure of FIG. 9 after etching utilizing the first cut mask 30A to provide a first fuse structure having the first dimension, and the second cut mask 30B to provide a second fuse structure having the second dimension. The etching removes portions of the hard mask 22, portions of the metal-containing material 28, portions of the dielectric material liner 26, portions of the first III-V compound semiconductor material 16 and portions of the third III-V compound semiconductor material 20 that are not covered by the first and second cut masks 30A, 30B. As is shown in FIG. 10A, this etch exposes portions of the semiconductor material 10. The etching used in this point of the present application may include one or more anisotropic etching processes such as, for example, one or more reactive ion etching processes.

The first fuse structure having the first dimension contains a remaining first portion of metal containing material 28 (hereinafter first metal structure 28A), a first remaining portion of the dielectric material liner 26 (hereinafter first dielectric material liner portion 26A), a first remaining portion of the hard mask 22 (hereinafter first hard mask portion 22A), a first remaining portion of the first III-V compound semiconductor material 16 (hereinafter first bottom III-V compound semiconductor material portion 16A), and a first remaining portion of the third III-V compound semiconductor material 20 (hereinafter first top III-V compound semiconductor material portion 20A). The first metal structure 28A of the first fuse structure has portions within the end regions 100, 102 having the first thickness, t1, as mentioned above, and a portion in the neck region 104 having the second thickness, t2, mentioned above. In some embodiments, a portion of the first metal structure 28A in neck region 104 may also have the third thickness, t3, mentioned above.

The second fuse structure having the second dimension contains a remaining second portion of metal containing material 28 (hereinafter second metal structure 28B), a second remaining portion of the dielectric material liner 26 (hereinafter second dielectric material liner portion 26B), a second remaining portion of the hard mask 22 (hereinafter second hard mask portion 22B), a second remaining portion of the first III-V compound semiconductor material 16 (hereinafter second bottom III-V compound semiconductor material portion 16B), and a second remaining portion of the third III-V compound semiconductor material 20 (hereinafter second top III-V compound semiconductor material portion 20B). The second metal structure 28B of the second fuse structure has portions within the end regions 100, 102 having the first thickness, t1, as mentioned above, and a portion in the neck region 104 having the second thickness, t2, mentioned above. In some embodiments, a portion of the second metal structure 28B in neck region 104 may also have the third thickness, t3, mentioned above.

Figure 11:
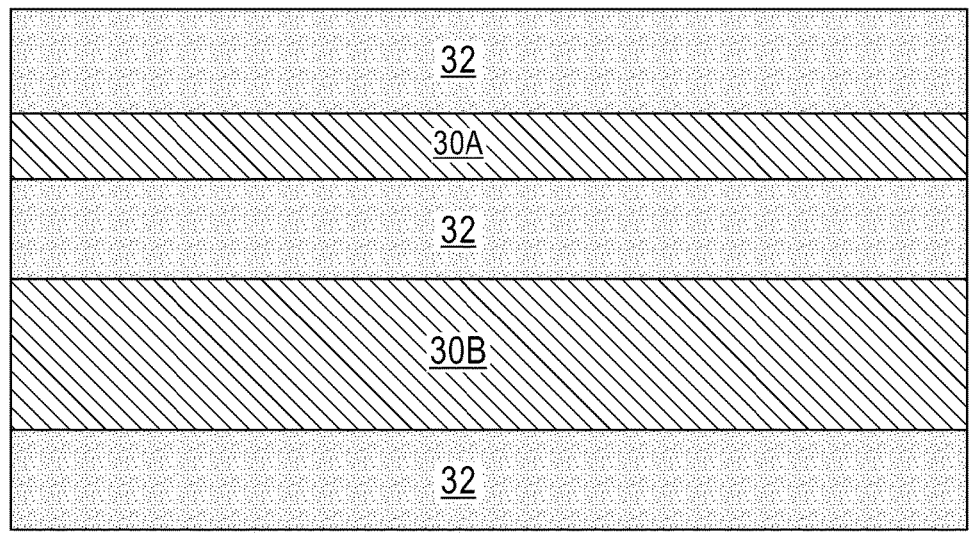
FIG. 11 is a top down view of the exemplary semiconductor structure of FIGS. 10A-10C after forming a planarized dielectric material between the first and second fuse structures.

Referring now to FIG. 11, there is illustrated the exemplary semiconductor structure of FIGS. 10A-10C after forming a planarized dielectric material 32 between the first and second fuse structures that are located beneath the first and second cut masks 30A, 30B, respectively. Although not shown in the drawing, the planarized dielectric material 32 has a bottommost surface that directly contacts the exposed portions of the semiconductor material 10 that are located between the first and second cut mask 30A, 30B. Also, and as not shown in the drawings, the planarized dielectric material 32 has a topmost surface that is coplanar with a topmost surface of the first and second cut mask 20A, 30B. Sidewall surfaces of the planarized dielectric material 32 also contact exposed sidewall surfaces of the first fuse structure (i.e., first metal structure 28A, and the first dielectric liner portion 26A), and exposed sidewall surfaces of the second fuse structure (i.e., second metal structure 28B, and the second dielectric liner portion 26B).

The planarized dielectric material 32 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the planarized dielectric material 32. The use of a self-planarizing dielectric material as the planarized dielectric material 32 may avoid the need to perform a subsequent planarizing step.

In one embodiment, the planarized dielectric material 32 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the planarized dielectric material 32, a planarization process or an etch back process follows the deposition of the dielectric material that provides the planarized dielectric material 32.

Figure 12A:
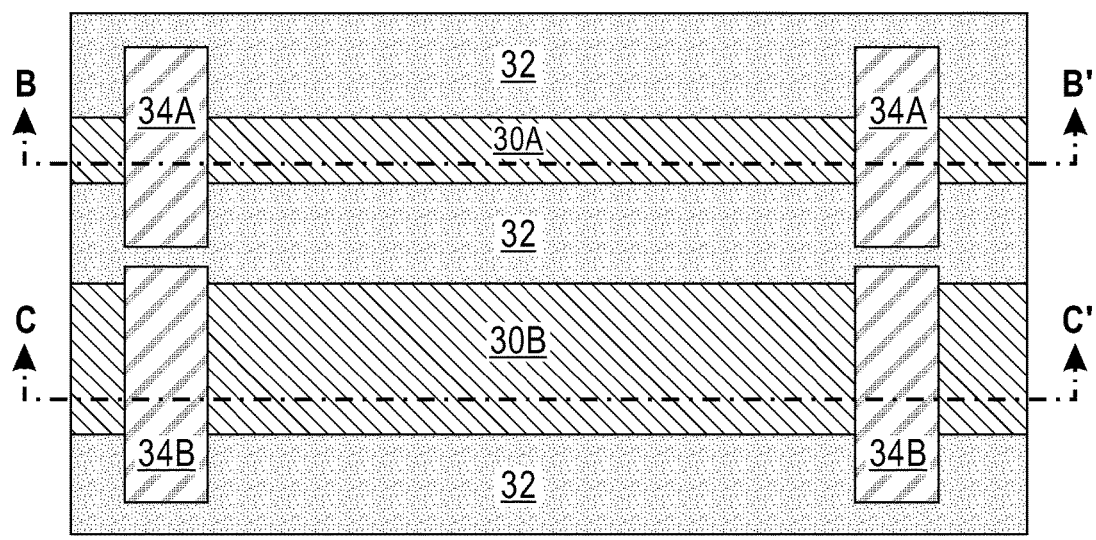
FIG. 12A is a top down view of the exemplary semiconductor structure of FIG. 11 after forming first contact structures contacting end regions of a topmost metal surface of the first fuse structure and second contact structures contacting end regions of a topmost metal surface of said second fuse structure.
Figure 12B:
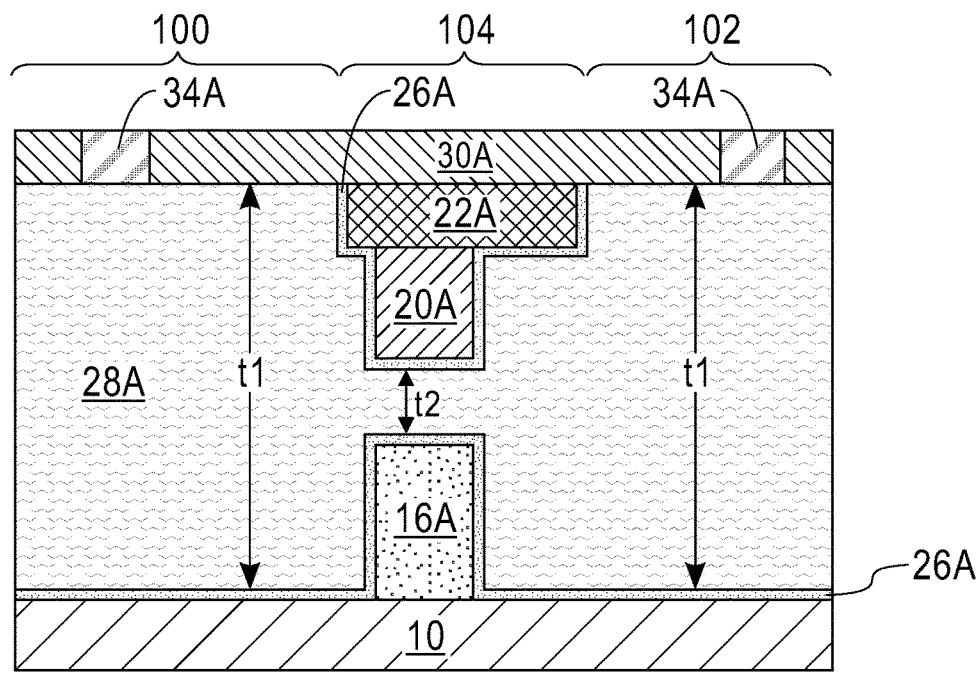
FIG. 12B is a cross view of the exemplary semiconductor structure of FIG. 12A through vertical plane B-B'.
Figure 12C:
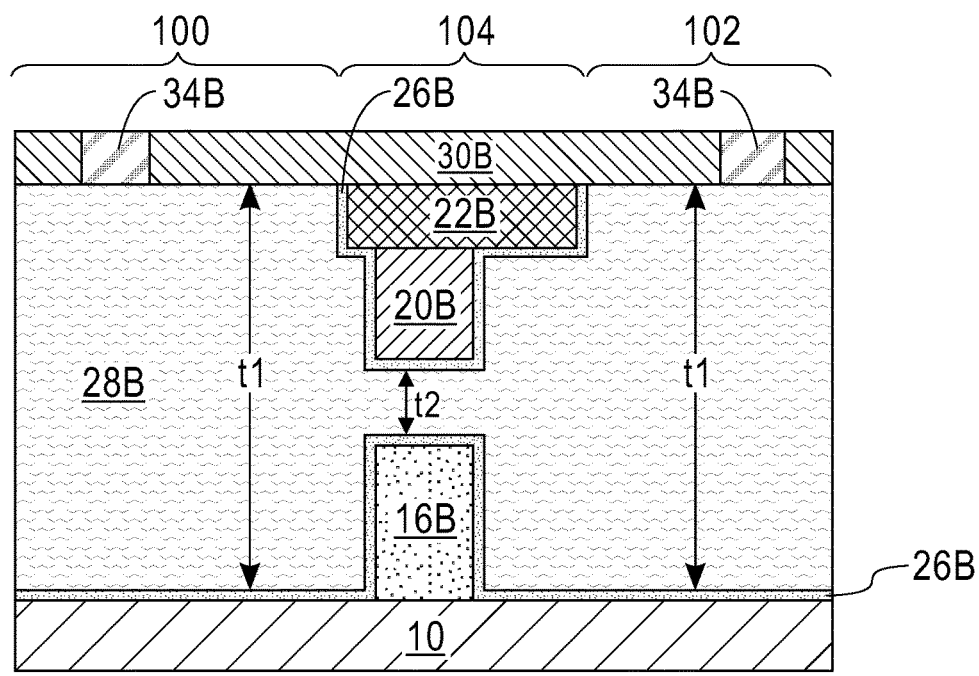
FIG. 12C is a cross view of the exemplary semiconductor structure of FIG. 12A through vertical plane C-C'.

Referring now to FIGS. 12A-12C, there are shown various views of the exemplary semiconductor structure of FIG. 11 after forming first contact structures 34A contacting end regions 100, 102 of a topmost metal surface of the first fuse structure (i.e., the first metal structure 28A) and second contact structures 34B contacting end regions 100, 102 of a topmost metal surface of said second fuse structure (i.e., the second metal structure 28B). The first and second contact structure 34A, 34B can be formed by first forming contact openings within the first and second cut masks 30A, 30B utilizing lithography and etching. After forming the contact openings within the first and second cut masks 30A, 30B a contact metal including, for example, one of the metals or metal alloys mentioned above for metal-containing material 28 can be formed into each contact opening utilizing any well known deposition process including plating. A planarization process may follow the deposition of the contact metal and provide the first and second contact structures 34A and 34B shown in FIGS. 12A-12C.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a fuse structure located above a first portion of a semiconductor material, said fuse structure comprising:
   a first end region comprising a first portion of a metal structure having a first thickness;
   a second end region comprising a second portion of said metal structure having said first thickness; and
   a neck region located between said first and second end regions, said neck region comprising a third portion of said metal structure having a second thickness that is less than said first thickness, wherein a portion of said neck region is located in a gap positioned between a bottom III-V compound semiconductor material portion and a top III-V compound semiconductor material portion.

2. The semiconductor structure of claim 1, further comprising a dielectric material liner portion having a dielectric constant greater than silicon dioxide separating said metal structure from said semiconductor material, sidewall surfaces and a topmost surface of said bottom III-V compound semiconductor material, and sidewall surfaces and a topmost surface of said top III-V compound semiconductor material.

3. The semiconductor structure of claim 1, further comprising a hard mask portion located on a topmost surface of said top III-V compound semiconductor material, said hard mask portion having a topmost surface that is coplanar with a topmost surface of said metal structure present in said first and second end regions of said fuse structure, and wherein a portion of said dielectric material liner portion is located on at least sidewall surfaces of said hard mask portion.

4. The semiconductor structure of claim 3, wherein said sidewall surfaces of said hard mask portion extend beyond sidewall surfaces of said top III-V semiconductor material.

5. The semiconductor structure of claim 1, wherein said top III-V compound semiconductor material portion has a defect density that is less than a defect density of said bottom III-V compound semiconductor material.

6. The semiconductor structure of claim 1, further comprising a cut mask located above said fuse structure, said cut mask having contact metal structures contacting a topmost surface of each of said first and second end regions of said metal structure.

7. The semiconductor structure of claim 1, further comprising another fuse structure located above a second portion of said semiconductor material and separated from said fuse structure by a planarized dielectric material, said another fuse structure comprising:

a first end region comprising a first portion of another metal structure having said first thickness;

a second end region comprising a second portion of said another metal structure having said first thickness; and a neck region located between the first and second end regions of said another metal structure, said neck region comprising a third portion of said another metal structure having said second thickness, wherein a portion of said neck region of said another metal structure is located in a gap positioned between another bottom III-V compound semiconductor material portion and another top III-V compound semiconductor material portion.

8. The semiconductor structure of claim 7, wherein said another fuse structure has a dimension that differs from a dimension of said fuse structure.

9. The semiconductor structure of claim 7, further comprising another dielectric material liner portion having a dielectric constant greater than silicon dioxide separating said another metal structure from said semiconductor material, sidewall surfaces and a topmost surface of said another bottom III-V compound semiconductor material, and sidewall surfaces and a topmost surface of said another top III-V compound semiconductor material.

10. The semiconductor structure of claim 7, wherein said another top III-V compound semiconductor material portion has a defect density that is less than a defect density of said another bottom III-V compound semiconductor material.

11. The semiconductor structure of claim 7, further comprising another cut mask located above said another fuse structure, said another cut mask having other contact metal structures contacting a topmost surface of each of said first and second end regions said another metal structure.

* * * * *